United States Patent
Kuan et al.

(10) Patent No.: US 12,267,076 B2
(45) Date of Patent: Apr. 1, 2025

(54) SIGNAL RECEIVING APPARATUS, CLOCK AND DATA RECOVERY CIRCUIT AND CLOCK AND DATA RECOVERY METHOD THEREOF

(71) Applicant: REALTEK SEMICONDUCTOR CORPORATION, Hsinchu (TW)

(72) Inventors: Chi-Kung Kuan, Hsinchu (TW); Li-Jun Gu, Suzhou (CN); Peng Huang, Suzhou (CN); Chia-Peng Fang, Hsinchu (TW); Zhi-Yong Tang, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 89 days.

(21) Appl. No.: 18/238,023

(22) Filed: Aug. 25, 2023

(65) Prior Publication Data

US 2025/0070786 A1 Feb. 27, 2025

(51) Int. Cl.
 *H03L 7/08* (2006.01)
 *H03L 7/091* (2006.01)
 *H04L 27/227* (2006.01)

(52) U.S. Cl.
 CPC ............ *H03L 7/0807* (2013.01); *H03L 7/091* (2013.01); *H04L 27/2275* (2013.01)

(58) Field of Classification Search
 CPC ....... H03L 7/0807; H03L 7/081; H03L 7/085; H03L 7/089; H03L 7/091; H04L 7/0334; H04L 7/0337; H04L 27/2275
 USPC ......... 375/326, 327, 374–376; 327/147, 148, 327/156, 157; 370/516
 See application file for complete search history.

(56) References Cited

U.S. PATENT DOCUMENTS

| | | | |
|---|---|---|---|
| 7,916,822 B2 * | 3/2011 | Aziz | H03L 7/081 |
| | | | 375/373 |
| 8,238,501 B2 | 8/2012 | Yang et al. | |
| 8,964,925 B1 * | 2/2015 | Saed | H03L 7/0807 |
| | | | 375/376 |
| 10,944,406 B1 * | 3/2021 | Du | H04L 7/033 |
| | (Continued) | | |

FOREIGN PATENT DOCUMENTS

TW        I358906 B        2/2012

OTHER PUBLICATIONS

OA letter of a counterpart TW application (appl. No. 112132652) mailed on Jun. 21, 2024.

*Primary Examiner* — Young T. Tse
(74) *Attorney, Agent, or Firm* — WPAT, PC

(57) ABSTRACT

The present disclosure discloses a clock and data recovery circuit. A sampling circuit performs burst mode over-sampling on an input analog data signal according to a sampling timing in a burst mode to generate over-sampling results. A selection circuit determines neighboring two of the over-sampling results having opposite logic states in the burst mode to select data edge sampling results and data center sampling results interlaced with each other and having the same time period with input analog data signal from the over-sampling results accordingly to be output sampling results. A phase detection circuit performs phase detection according to the output sampling result to generate a phase locking direction. A phase adjusting circuit adjusts the sampling timing of the sampling circuit according to the phase locking direction to track the input analog data signal.

20 Claims, 4 Drawing Sheets

(56) References Cited

U.S. PATENT DOCUMENTS

| | | | |
|---|---|---|---|
| 2005/0286643 A1* | 12/2005 | Ozawa | H03L 7/087 375/376 |
| 2006/0034394 A1* | 2/2006 | Popescu | H03L 7/087 375/360 |
| 2010/0289544 A1* | 11/2010 | Lee | H04L 25/062 327/159 |
| 2020/0266968 A1* | 8/2020 | Liu | H03L 7/0807 |

* cited by examiner

SIGNAL RECEIVING APPARATUS, CLOCK AND DATA RECOVERY CIRCUIT AND CLOCK AND DATA RECOVERY METHOD THEREOF

BACKGROUND OF THE INVENTION

1. Field of the Invention

The present disclosure relates to a signal receiving apparatus, a clock and data recovery circuit and a clock and data recovery method thereof.

2. Description of Related Art

In high speed transmission communication system, a clock and data recovery (CDR) circuit is used to guarantee that the data signal can be received correctly. In some approaches, the clock and data recovery circuit samples the data signal with a slower speed to determine the relation between the data signal (e.g., the positions of the data edge and the data center) and the sampling signal accordingly and gradually adjusts the sampling timing of the sampling signal to track the data signal.

However, in application such as passive optical network (PON), the signal receiving apparatus that operates as an optical line terminal (OLT) often switches to be connected with different optical network terminals (ONT) to receive signals therefrom. When the clock and data recovery is performed with a slower speed, the data signal can not be tracked quickly. The data signal can not be received correctly accordingly.

SUMMARY OF THE INVENTION

In consideration of the problem of the prior art, an object of the present disclosure is to provide a signal receiving apparatus, a clock and data recovery circuit and a clock and data recovery method thereof.

The present invention discloses a clock and data recovery (CDR) circuit that includes a sampling circuit, a selection circuit, a phase detection circuit and a phase adjusting circuit. The sampling circuit is configured to perform a burst mode over-sampling on an input analog data signal according to a sampling timing in a burst mode to generate a plurality of over-sampling results. The selection circuit is configured to determine neighboring two of the over-sampling results having opposite logic states in the burst mode to accordingly select a plurality of data edge sampling results and a plurality of data center sampling results interlaced with each other and having a same time period with the input analog data signal from the over-sampling results to output a plurality of output sampling results. The phase detection circuit is configured to perform phase detection according to the output sampling results to generate a phase locking direction. The phase adjusting circuit is configured to adjust the sampling timing of the sampling circuit according to the phase locking direction to track the input analog data signal.

The present invention also discloses a clock and data recovery method that includes steps outlined below. A burst mode over-sampling is performed on an input analog data signal by a sampling circuit according to a sampling timing in a burst mode to generate a plurality of over-sampling results. Neighboring two of the over-sampling results having opposite logic states are determined in the burst mode by a selection circuit to accordingly select a plurality of data edge sampling results and a plurality of data center sampling results interlaced with each other and having a same time period with the input analog data signal from the over-sampling results to output a plurality of output sampling results. Phase detection is performed according to the output sampling results by a phase detection circuit to generate a phase locking direction. The sampling timing of the sampling circuit is adjusted according to the phase locking direction by a phase adjusting circuit to track the input analog data signal.

The present invention further discloses a signal receiving apparatus that includes an equalizer circuit, a clock and data recovery circuit and a digital processing circuit. The equalizer circuit is configured to receive an external signal perform equalization thereon to generate an input analog data signal. The clock and data recovery circuit includes a sampling circuit, a selection circuit, a phase detection circuit and a phase adjusting circuit. The sampling circuit is configured to perform a burst mode over-sampling on the input analog data signal according to a sampling timing in a burst mode to generate a plurality of over-sampling results. The selection circuit is configured to determine neighboring two of the over-sampling results having opposite logic states in the burst mode to accordingly select a plurality of data edge sampling results and a plurality of data center sampling results interlaced with each other and having a same time period with the input analog data signal from the over-sampling results to output a plurality of output sampling results. The phase detection circuit is configured to perform phase detection according to the output sampling results to generate a phase locking direction. The phase adjusting circuit is configured to adjust the sampling timing of the sampling circuit according to the phase locking direction to track the input analog data signal. The digital processing circuit is configured to receive and process an output digital data signal from the selection circuit.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a signal receiving apparatus, a clock and data recovery circuit and a clock and data recovery method thereof to perform a burst mode over-sampling in a burst mode by a sampling circuit to generate over-sampling results such that positions of a data edge and a data center can be determined by a selection circuit quickly to further perform phase detection accordingly by a phase detection circuit to generate a phase locking direction. A sampling timing of the sampling circuit can therefore be adjusted according to the phase locking direction by a phase adjusting circuit to accomplish a quick locking mechanism.

Figure 1:
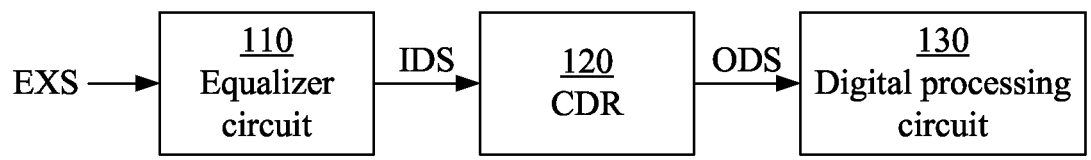
FIG. 1 illustrates a block diagram of a signal receiving apparatus according to an embodiment of the present invention.

Reference is now made to FIG. 1. FIG. 1 illustrates a block diagram of a signal receiving apparatus 100 according to an embodiment of the present invention. The signal receiving apparatus 100 includes an equalizer circuit 110, a clock and data recovery circuit 120 (abbreviated as CDR in FIG. 1) and a digital processing circuit 130.

The equalizer circuit 110 is configured to receive and perform equalization an external signal EXS to generate an input analog data signal IDS. In an embodiment, the equalizer circuit 110 may include such as, but not limited to an analog equalizer, a decision feedback equalizer (DFE) or a combination thereof to perform corresponding equalization on the external signal EXS respectively.

The clock and data recovery circuit 120 is configured to perform clock and data recovery on the input analog data signal IDS to generate an output digital data signal ODS. The digital processing circuit 130 is configured to receive and process the output digital data signal ODS.

In an embodiment, the signal receiving apparatus 100 is used in passive optical network technology and operates as an optical line terminal in the passive optical network. The optical line terminal may switch to be connected to different optical network terminals serving as signal sources within a short period of time to receive different data signals. When the clock and data recovery circuit 120 of the signal receiving apparatus 100 can not quickly track the frequency and phase of the received signals, the clock and data recovery is not performed quickly enough and the data can not be received correctly.

Figure 2:
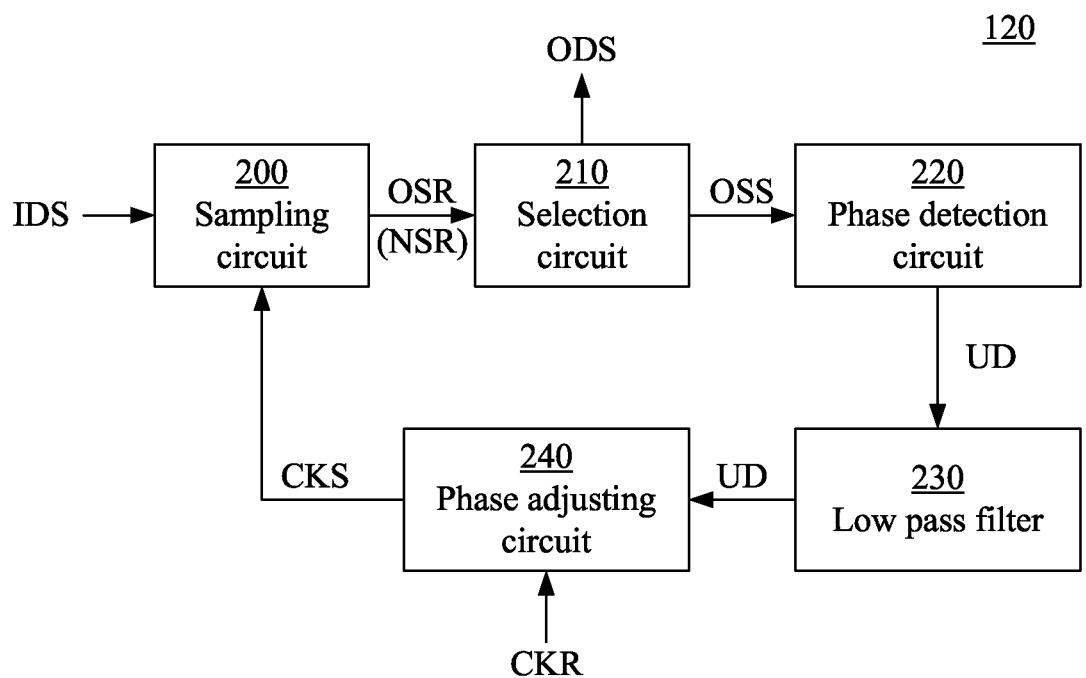
FIG. 2 illustrates a block diagram of the clock and data recovery circuit according to an embodiment of the present invention.

Reference is now made to FIG. 2. FIG. 2 illustrates a block diagram of the clock and data recovery circuit 120 according to an embodiment of the present invention. In an embodiment, the clock and data recovery circuit 120 operates selectively in a burst mode and a normal mode. The clock and data recovery circuit 120 provides a quick locking mechanism in the burst mode. The configuration the clock and data recovery circuit 120 and the operation in the burst mode thereof are described first in the following paragraphs.

The clock and data recovery circuit 120 includes a sampling circuit 200, a selection circuit 210, a phase detection circuit 220, a low pass filter 230 and a phase adjusting circuit 240.

The sampling circuit 200 is configured to perform a burst mode over-sampling on the input analog data signal IDS according to a sampling timing in the burst mode to generate a plurality of over-sampling results OSR. Each piece of data in the input analog data signal IDS corresponds to the over-sampling results OSR having an amount of $2^N$, in which N is an integer larger than 1.

Figure 3:
FIG. 3 illustrates a diagram of the burst mode over-sampling performed on the input analog data signal by the sampling circuit according to the sampling timing according to an embodiment of the present invention.

Reference is now made to FIG. 3 at the same time. FIG. 3 illustrates a diagram of the burst mode over-sampling performed on the input analog data signal IDS by the sampling circuit 200 according to the sampling timing according to an embodiment of the present invention.

As illustrated in FIG. 3, the input analog data signal IDS includes a plurality of pieces of data labeled as data $DA_0$-$DA_2$. In the present embodiment, based on the burst mode over-sampling performed by the sampling circuit 200, each of the pieces of the data $DA_0$-$DA_2$ corresponds to 8 (N=3) over-sampling results OSR. Each of the over-sampling results OSR has a corresponding logic state. It is appreciated that the number described above is merely an example. In practical implementation, based on the burst mode over-sampling performed by the sampling circuit 200, each of the pieces of data $DA_0$-$DA_2$ may correspond other amounts of over-sampling results OSR in the form of $2^N$, N being larger than 1.

More specifically, the data $DA_0$ is sampled according to the sampling timing including the sampling time spots T00-T07 to generate the over-sampling results OSR each having a high logic state (1). The data $DA_1$ is sampled according to the sampling timing defined by the sampling time spots T10-T17 to generate the over-sampling results OSR each having a low logic state (0). The data $DA_2$ is sampled according to the sampling timing including the sampling time spots T20-T27 to generate the over-sampling results OSR each having a high logic state (1).

The sampling circuit 200 performs sampling on the input analog data signal IDS according to the sampling timing provided by the sampling clock signal CKS generated by the phase adjusting circuit 240 in FIG. 2. In an embodiment, the sampling clock signal CKS may be generated by the sampling circuit 200 according to an external reference clock signal CKR.

In an embodiment, the sampling clock signal CKS can be a single high frequency clock signal having a frequency higher than the frequency of the input analog data signal IDS such that the sampling circuit 200 performs the burst mode over-sampling according to the sampling timing provided by the high frequency clock signal. The sampling timing may correspond to the timings of a plurality of edges (positive edges and/or negative edges) of the high frequency clock signal within a piece of data.

In another embodiment, the sampling clock signal CKS is multi-phase clock signals having the frequency not higher than the frequency of the input analog data signal IDS such that the sampling circuit 200 performs the burst mode over-sampling according to the sampling timing provided by the multi-phase clock signals. The sampling timing of the multi-phase clock signals may correspond to the timings of a plurality of edges (positive edges and/or negative edges) of the clock signals with different phases within a piece of data.

The selection circuit 210 in FIG. 2 is configured to determine neighboring two of the over-sampling results OSR having opposite logic states in the burst mode to accordingly select a plurality of data edge sampling results and a plurality of data center sampling results interlaced with each other and having a same time period with the input analog data signal IDS from the over-sampling results OSR to output a plurality of output sampling results In an embodiment, the selection circuit 210 first determines one of neighboring two of over-sampling results having the opposite logic states to be a data edge, and selects the data edge sampling results and the data center sampling results according to the data edge such that one of the data edge sampling results corresponds to the data edge.

For example, the over-sampling results OSR corresponding to the sampling time spots T07 and T10 in FIG. 3 are at a high state and at a low state respectively. The selection circuit 210 in FIG. 2 may determine the latter one of the neighboring two of the over-sampling results OSR having the opposite logic states, i.e., the over-sampling result OSR corresponding to the sampling time spot T10 to be the data edge.

The selection circuit 210 selects the over-sampling results OSR corresponding to the sampling time spots T10 and T20 to be the data edge sampling results E0 and E1. One of the data edge sampling results E0 and E1 corresponds to the data edge (which is the data edge sampling result E0) and the time period length of the data edge sampling results E0 and E1 is the same as the time period length of the input analog data signal IDS. It is appreciated that in FIG. 3, the data $DA_2$ is lastly labeled. However, the same selection mechanism can be performed by the selection circuit 210 on the over-sampling results OSR generated according to the data behind the data $DA_2$.

The selection circuit 210 further selects the over-sampling results OSR corresponding to the sampling time spots T14 and T24 to be the data center sampling results D0 and D1. The data center sampling results D0 and D1 and the data edge sampling results E0 and E1 are interlaced with each other. More specifically, the data center sampling result D0 is the middlemost point between the data edge sampling results E0 and E1 and the data center sampling result D1 is in the middlemost point between the data edge sampling result E1 and the data edge sampling result behind the data edge sampling result E1. The data center sampling results D0 and D1 are therefore interlaced with the data edge sampling results E0 and E1. It is appreciated that in FIG. 3, the data $DA_2$ is lastly labeled. However, the same selection mechanism can be performed by the selection circuit 210 on the over-sampling results OSR generated according to the data behind the data $DA_2$.

It is appreciated that according to different positions of the neighboring two of the over-sampling results OSR having the opposite logic states, the selection circuit 210 also determines different positions of the data edge.

For example, when the two over-sampling results OSR corresponding to the sampling time spots T10 and T11 have the opposite logic states, the selection circuit 210 determines the over-sampling result OSR corresponding to the sampling time spot T11 to be the data edge and selects the over-sampling results OSR corresponding to the sampling time spots T11, T15 and T21 in turn as the data edge sampling result E0, the data center sampling result D0 and the data edge sampling result E1. When the two over-sampling results OSR corresponding to the sampling time spots T13 and T14 have the opposite logic states, the selection circuit 210 determines the over-sampling result OSR corresponding to the sampling time spot T14 to be the data edge and selects the over-sampling results OSR corresponding to the sampling time spots T14, T20 and T24 in turn as the data edge sampling result E0, the data center sampling result D0 and the data edge sampling result E1. So on and so forth.

Besides, the selection circuit 210 in FIG. 2 may selectively determine the former one of the neighboring two of the over-sampling results OSR having the opposite logic states, e.g., the over-sampling result OSR corresponding to the sampling time spot T07 in FIG. 3, to be the data edge and select the data edge sampling results and the data center sampling results accordingly.

By using the selection mechanism described above, the selection circuit 210 in FIG. 2 generates the output sampling results OSS in turn including the data edge sampling result E0, the data center sampling result D0, the data edge sampling result E1 and the data center sampling result D1. On the other hand, the selection circuit 210 may output the selected data center sampling results D0 and D1 as the output digital data signal ODS. The digital processing circuit 130 in FIG. 1 is configured to receive the output digital data signal ODS from the selection circuit 210 and perform processing thereon.

The phase detection circuit 220 is configured to perform phase detection according to the output sampling results OSS to generate the phase locking direction UD.

In an embodiment, the phase detection circuit 220 performs phase detection according to a logic state relation among consecutive three of the output sampling results OSS. For example, the phase detection circuit 220 may perform phase detection according to the logic state relation among the data edge sampling result E0, the data center sampling result D0 and data edge sampling result E1 and generate a phase locking direction UD according to the phase detection result.

Reference is now made to Table 1. Table 1 illustrates the corresponding relation between the output sampling results OSS and the phase locking direction UD according to an embodiment of the present invention. In the present embodiment, the logic state relation among the data edge sampling result E0, the data center sampling result D0 and the data edge sampling result E1 is taken as an example. A value 1 of the phase locking direction UD stands for a forward direction and a value −1 of the phase locking direction UD stands for a backward direction.

TABLE 1

| OSS | | | |
|---|---|---|---|
| E0 | D0 | E1 | UD |
| 0 | 0 | 1 | 1 |
| 1 | 1 | 0 | 1 |
| 0 | 1 | 1 | −1 |
| 1 | 0 | 0 | −1 |
| 0 | 0 | 0 | 0 |
| 1 | 1 | 1 | 0 |
| 0 | 1 | 0 | N/A |
| 1 | 0 | 1 | N/A |

As illustrated in Table 1, when the logic state relation among the data edge sampling result E0, the data center sampling result D0 and the data edge sampling result E1 includes the low state, the low state and the high state which is represented as (001) or includes the high state, the high state and the low state which is represented as (110), the phase detection result is "lag". In other words, the sampling timing of the sampling circuit 200 that samples the input analog data signal IDS lags behind the input analog data signal IDS. Under such a condition, the phase detection circuit 220 generates the phase locking direction UD having the value of 1 that corresponds to "forward direction".

When the logic state relation among the data edge sampling result E0, the data center sampling result D0 and the data edge sampling result E1 includes the low state, the high state and the high state which is represented as (011) or includes the high state, the low state and the low state which is represented as (100), the phase detection result is "lead". In other words, the sampling timing of the sampling circuit 200 that samples the input analog data signal IDS leads the input analog data signal IDS. Under such a condition, the phase detection circuit 220 generates the phase locking direction UD having the value of −1 that corresponds to "backward direction".

When the logic state relation among the data edge sampling result E0, the data center sampling result D0 and the data edge sampling result E1 includes all low states which is represented as (000) or all high states which is represented as (111), the phase detection circuit 220 can not determine the phase relation and generate the phase locking direction UD having the value of 0 that does not correspond to any direction.

Besides, since at least consecutive two of the data edge sampling result E0, the data center sampling result D0 and the data edge sampling result E1 are generated by sampling the same piece of data, the logic state relation including the low state, the high state and the low state which is represented as (010) and the logic state relation including the high state, the low state and the high state which is represented as (101) do not occur in practical implementation.

Corresponding to the embodiment in FIG. 3, since the logic state relation among the data edge sampling result E0, the data center sampling result D0 and the data edge sampling result E1 includes the low state, the high state and the high state which is represented as (011), the phase detection circuit 220 generates the phase locking direction UD having the value of 1 that corresponds to "forward direction".

It is appreciated that the embodiment described above uses the condition that the phase detection is performed according to the three consecutive output sampling results OSS including the data edge sampling result E0, the data center sampling result D0 and the data edge sampling result E1 as an example. In other embodiments, the phase detection circuit 220 may perform phase detection according to the logic state relation among the data center sampling results D0, the data edge sampling results E1 and the data center sampling results D1 or according to the logic state relation of more amounts of consecutive output sampling results. The present invention is not limited thereto.

The low pass filter 230 is configured to perform filtering on the phase locking direction UD. The phase adjusting circuit 240 is configured to adjust the sampling timing of the sampling circuit 200 according to the filtered phase locking direction UD to track the input analog data signal IDS. More specifically, according to the filtered phase locking direction UD, the phase adjusting circuit 240 adjusts the timing of the sampling clock signal CKS to adjust the sampling timing of the sampling circuit 200.

It is appreciated that the clock and data recovery circuit 120 may selectively dispose the low pass filter 230 and may also selectively not dispose the low pass filter 230 such that the phase adjusting circuit 240 receives the phase locking direction UD directly generated by the phase detection circuit 220.

In an embodiment, the input analog data signal IDS 在 the phase locking direction UD is determined to be locked when occurrence probabilities of the phase locking direction determined to be the forward direction and the backward direction are substantially the same. It is appreciated that the term "substantially" means that the occurrence probabilities of the phase locking direction determined to be the forward direction and the backward direction may have a reasonable difference therebetween and may not necessarily completely equal to each other.

For example, the phase adjusting circuit 240 may perform statistics on the number of occurrence of the value of 1 of the phase locking direction UD (corresponding to the forward direction) and the number of occurrence of the value of −1 of the phase locking direction UD (corresponding to the backward direction). When the statistic result shows that the numbers of occurrence of the forward direction and the backward direction only have a slight different and are substantially the same, the phase adjusting circuit 240 determines that the occurrence probabilities of the phase locking direction determined to be the forward direction and the backward direction are substantially the same, and further determines that the input analog data signal IDS is locked.

In an embodiment, when the clock and data recovery circuit 120 is determined to be not required to operate in the burst mode since the input analog data signal IDS is determined to be locked or due to other factors, the clock and data recovery circuit 120 operates in the normal mode. The operation of the normal mode is described in accompany with FIG. 2 and FIG. 3.

In an embodiment, the sampling circuit 200 keeps performing burst mode over-sampling on the input analog data signal IDS in the normal mode. The selection circuit 210 selects the data edge sampling results and the data center sampling results according to one of the over-sampling results OSR in the normal mode to output the output sampling results OSS. More specifically, the selection circuit 210 may determine any one of the over-sampling results OSR to be the data edge so as to select the data edge sampling results and the data center sampling results by using the method described above to output the output sampling results OSS.

Preferably, when the clock and data recovery circuit 120 switches from the burst mode to the normal mode, the selection performed in the burst mode can be kept. For example, when the selection circuit 210 selects the over-sampling results OSR corresponding to the sampling time spot T10, T14, T20 and T24 to output the output sampling results OSS before the burst mode is terminated, the selection circuit 210 may keep the same selection in the normal mode.

However, the clock and data recovery circuit 120 may perform more arbitrary selection in the normal mode. For example, the selection circuit 210 may determine the over-sampling result OSR corresponding to the sampling time spot T03 in FIG. 3 to be the data edge to further select the over-sampling results OSR corresponding to the sampling time spots T03, T07 and T13 as the data edge sampling result E0, the data center sampling result D0 and the data edge sampling result E1 by using the method described above to output the output sampling results OSS.

In another embodiment, the sampling circuit 200 performs a normal mode sampling on the input analog data signal IDS in the normal mode to generate a plurality of normal sampling results NSR, wherein each piece of data in the input analog data signal IDS corresponds to the normal sampling results NSR having an amount of 2. More specifically, the sampling circuit 200 may perform normal mode sampling according to a clock signal having a lower frequency or having fewer phases to generate the normal sampling results NSR.

Figure 4:
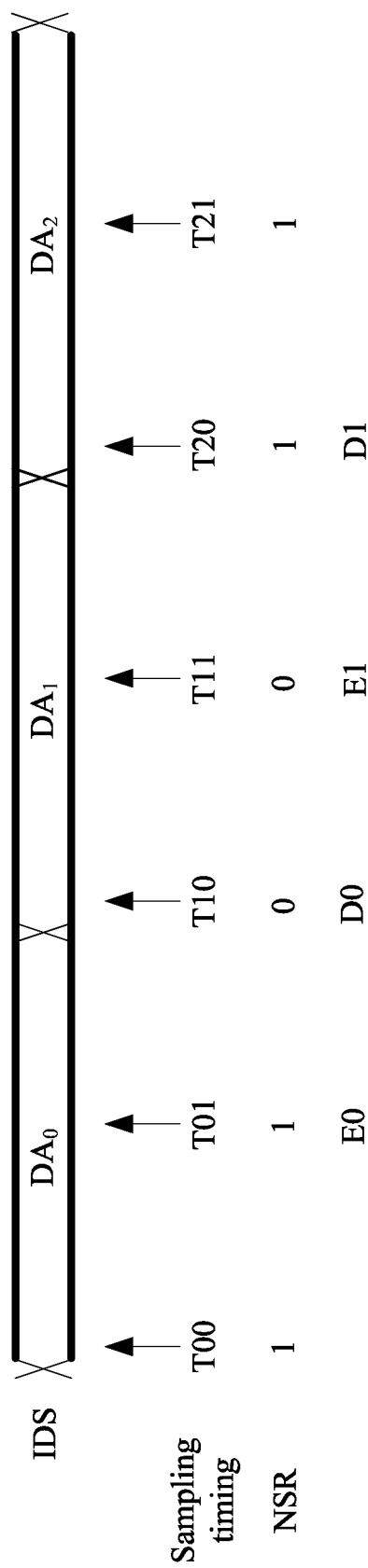
FIG. 4 illustrates a diagram of the normal mode sampling performed on the input analog data signal by the sampling circuit according to the sampling timing according to an embodiment of the present invention.

Reference is now made to FIG. 4. FIG. 4 illustrates a diagram of the normal mode sampling performed on the input analog data signal IDS by the sampling circuit 200 according to the sampling timing according to an embodiment of the present invention.

Similar to FIG. 3, the input analog data signal IDS includes a plurality of pieces of data labeled as the data $DA_0$-$DA_2$. In the embodiment in FIG. 4, based on the normal mode sampling performed by the sampling circuit 200, each of the pieces of the data $DA_0$-$DA_2$ corresponds to 2 normal sampling results NSR. Each of the normal sampling results NSR has a corresponding logic state.

More specifically, the data $DA_0$ is sampled according to the sampling timing including the sampling time spots T00-T01 to generate the normal sampling results NSR each having a high logic state (1). The data $DA_1$ is sampled according to the sampling timing including the sampling time spots T10-T11 to generate the normal sampling results NSR each having a low logic state (0). The data $DA_2$ is sampled according to the sampling timing including the sampling time spots T20-T21 to generate the normal sampling results NSR each having a high logic state (1).

The selection circuit 210 determines the neighboring two of normal sampling results NSR having the opposite logic states in the normal mode, to select the data edge sampling results and the data center sampling results from the normal sampling results NSR to output the output sampling results OSS. More specifically, the selection circuit 210 first determine one of the neighboring two of normal sampling results NSR having the opposite logic states, and select the data edge sampling results and the data center sampling results according to the data edge such that one of the data edge sampling results corresponds to the data edge.

For example, corresponding to the neighboring two of normal sampling results NSR having opposite logic states that correspond to the sampling time spots T01 and T10, the selection circuit 210 may determine the latter one to be the data edge, select the normal sampling results NSR corresponding to the sampling time spots T01 and T11 to be the data edge sampling results E0 and E1 and select the normal sampling results NSR corresponding to the sampling time spots T10 and T20 to be the data center sampling results D0 and D1 by using the selection method described in the previous embodiments and output the output sampling results OSS.

In any one of the embodiments of the normal mode, the phase detection circuit 220, the low pass filter 230 and the phase adjusting circuit 240 may perform the same operation as in the burst mode after the selection circuit 210 outputs the output sampling results OSS. The detail is not described herein.

In some approaches, the clock and data recovery circuit performs the determination of the data edge and the data center in a slower speed and gradually adjust the sampling timing to track the input analog data signal. However, in the application of such as passive optical network technology, the signal receiving apparatus operating as an optical line terminal often switches to be connected to different optical network terminals serving as signal sources within a short period of time to receive different data signals. When the clock and data recovery circuit 120 of the data signal can not be tracked quickly and the data can not be received correctly.

The clock and data recovery circuit of the present invention performs a burst mode over-sampling in a burst mode by a sampling circuit to generate over-sampling results such that positions of a data edge and a data center can be determined by a selection circuit quickly to further perform phase detection accordingly by a phase detection circuit to generate a phase locking direction. A sampling timing of the sampling circuit can therefore be adjusted according to the phase locking direction by a phase adjusting circuit to accomplish a quick locking mechanism. In an embodiment, the clock and data recovery circuit in the present invention can lock the input analog data signal in a time period in the order of nanosecond (NS) to receive the data correctly.

Figure 5:
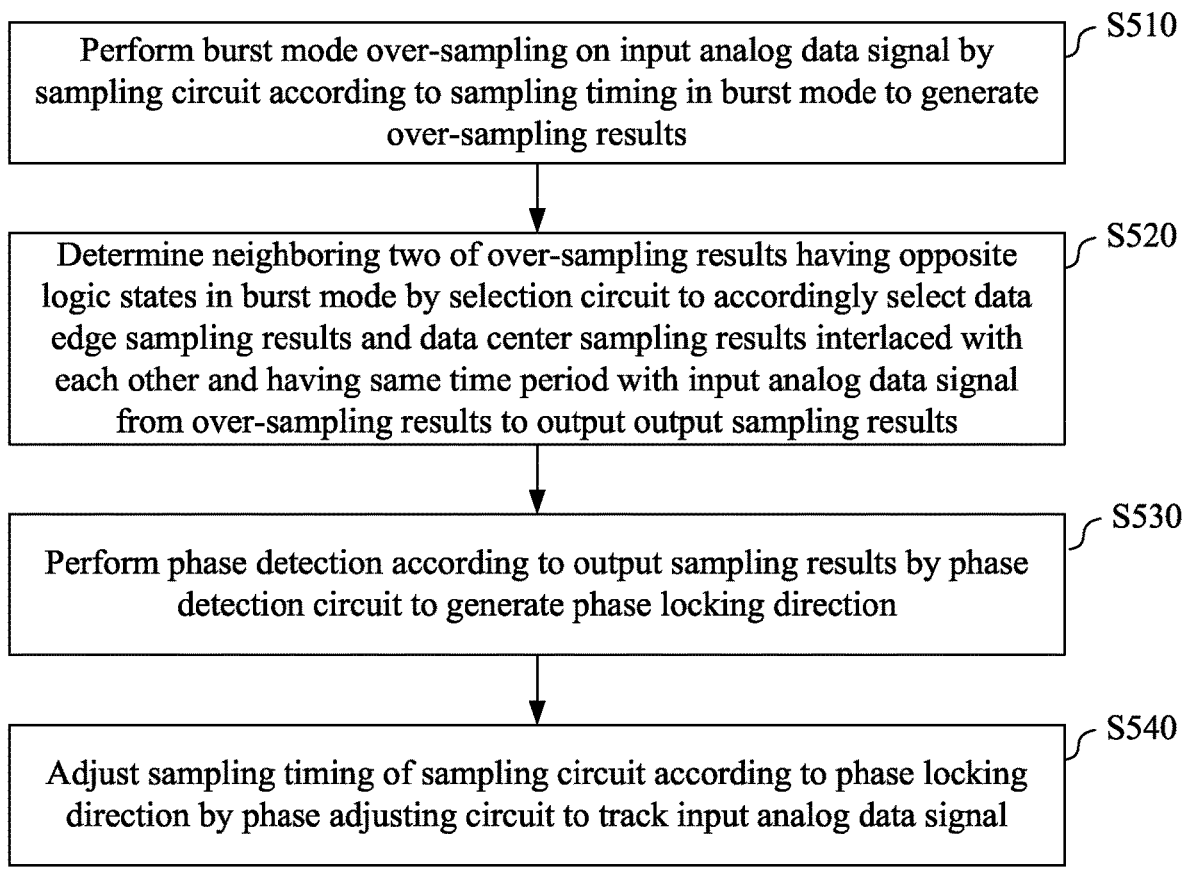
FIG. 5 illustrates a flow chart of a clock and data recovery method according to an embodiment of the present invention.

Reference is now made to FIG. 5. FIG. 5 illustrates a flow chart of a clock and data recovery method 500 according to an embodiment of the present invention.

Besides the apparatus described above, the present invention further discloses the clock and data recovery method 500 that can be used in such as, but not limited to the clock and data recovery circuit 120 illustrated in FIG. 2. An embodiment of the clock and data recovery method 500 is illustrated in FIG. 5 and includes the steps outlined below.

In step S510, the burst mode over-sampling is performed on the input analog data signal IDS by the sampling circuit 200 according to the sampling timing in the burst mode to generate the over-sampling results OSR, wherein each piece of data in the input analog data signal IDS corresponds to the over-sampling results OSR having an amount of $2^N$, in which N is an integer larger than 1.

In step S520, the neighboring two of the over-sampling results having opposite logic states are determined in the burst mode by the selection circuit 210 to accordingly select the data edge sampling results and the data center sampling results interlaced with each other and having the same time period with the input analog data signal IDS from the over-sampling results OSR to output the output sampling results OSS.

In step S530, phase detection is performed according to the output sampling results OSS by the phase detection circuit 220 to generate the phase locking direction UD.

In step S540, the sampling timing of the sampling circuit 200 is adjusted according to the phase locking direction UD by the phase adjusting circuit 240 to track the input analog data signal IDS.

It is appreciated that the embodiments described above are merely an example. In other embodiments, it is appreciated that many modifications and changes may be made by those of ordinary skill in the art without departing, from the spirit of the invention.

In summary, the signal receiving apparatus, the clock and data recovery circuit and the clock and data recovery method thereof perform a burst mode over-sampling in a burst mode by a sampling circuit to generate over-sampling results such that positions of a data edge and a data center can be determined by a selection circuit quickly to further perform phase detection accordingly by a phase detection circuit to generate a phase locking direction. A sampling timing of the sampling circuit can therefore be adjusted according to the phase locking direction by a phase adjusting circuit to accomplish a quick locking mechanism.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A clock and data recovery (CDR) circuit, comprising:
    a sampling circuit configured to perform a burst mode over-sampling on an input analog data signal according to a sampling timing in a burst mode to generate a plurality of over-sampling results;
    a selection circuit configured to determine neighboring two of the over-sampling results having opposite logic states in the burst mode to accordingly select a plurality of data edge sampling results and a plurality of data center sampling results interlaced with each other and having a same time period with the input analog data signal from the over-sampling results to output a plurality of output sampling results;
    a phase detection circuit configured to perform phase detection according to the output sampling results to generate a phase locking direction; and
    a phase adjusting circuit configured to adjust the sampling timing of the sampling circuit according to the phase locking direction to track the input analog data signal.

2. The clock and data recovery circuit of claim 1, wherein the selection circuit determines one of the neighboring two of the over-sampling results having the opposite logic states to be a data edge, and selects the data edge sampling results and the data center sampling results according to the data edge such that one of the data edge sampling results corresponds to the data edge.

3. The clock and data recovery circuit of claim 1, wherein the phase detection circuit performs phase detection according to a logic state relation among consecutive three of the output sampling results.

4. The clock and data recovery circuit of claim 1, wherein the selection circuit selects the data edge sampling results and the data center sampling results from the over-sampling results according to one of the over-sampling results in a normal mode to output the output sampling results.

5. The clock and data recovery circuit of claim 1, wherein the sampling circuit performs a normal mode sampling on the input analog data signal in a normal mode to generate a plurality of normal sampling results, wherein each piece of data in the input analog data signal corresponds to the normal sampling results having an amount of 2; and
the selection circuit determines neighboring two of the normal sampling results having the opposite logic states in the normal mode, to accordingly selects the data edge sampling results and the data center sampling results from the normal sampling results to output the output sampling results.

6. The clock and data recovery circuit of claim 1, wherein the selection circuit outputs the data center sampling results to be an output digital data signal.

7. The clock and data recovery circuit of claim 1, wherein the sampling circuit performs the burst mode over-sampling according to the sampling timing of a high frequency clock signal having a frequency higher than the frequency of the input analog data signal, or performs the burst mode over-sampling according to the sampling timing of multi-phase clock signals having the frequency not higher than the frequency of the input analog data signal.

8. The clock and data recovery circuit of claim 1, wherein the input analog data signal is determined to be locked when occurrence probabilities of the phase locking direction determined to be a forward direction and a backward direction are substantially the same.

9. A clock and data recovery method, comprising:
performing a burst mode over-sampling on an input analog data signal by a sampling circuit according to a sampling timing in a burst mode to generate a plurality of over-sampling results;
determining neighboring two of the over-sampling results having opposite logic states in the burst mode by a selection circuit to accordingly select a plurality of data edge sampling results and a plurality of data center sampling results interlaced with each other and having a same time period with the input analog data signal from the over-sampling results to output a plurality of output sampling results;
performing phase detection according to the output sampling results by a phase detection circuit to generate a phase locking direction; and
adjusting the sampling timing of the sampling circuit according to the phase locking direction by a phase adjusting circuit to track the input analog data signal.

10. The clock and data recovery method of claim 9, further comprising:
determining one of the neighboring two of the over-sampling results having the opposite logic states to be a data edge and selecting the data edge sampling results and the data center sampling results according to the data edge by the selection circuit such that one of the data edge sampling results corresponds to the data edge.

11. The clock and data recovery method of claim 9, wherein the phase detection circuit performs phase detection according to a logic state relation among consecutive three of the output sampling results.

12. The clock and data recovery method of claim 9, further comprising:
selecting the data edge sampling results and the data center sampling results from the over-sampling results according to one of the over-sampling results by the selection circuit in a normal mode to output the output sampling results.

13. The clock and data recovery method of claim 9, further comprising:
performing a normal mode sampling on the input analog data signal by the sampling circuit in a normal mode to generate a plurality of normal sampling results, wherein each piece of data in the input analog data signal corresponds to the normal sampling results having an amount of 2; and
determining neighboring two of the normal sampling results having the opposite logic states by the selection circuit in the normal mode, to accordingly selects the data edge sampling results and the data center sampling results from the normal sampling results to output the output sampling results.

14. The clock and data recovery method of claim 9, further comprising:
outputting the data center sampling results to be an output digital data signal by the selection circuit.

15. The clock and data recovery method of claim 9, further comprising:
performing the burst mode over-sampling according to the sampling timing of a high frequency clock signal having a frequency higher than the frequency of the input analog data signal, or performing the burst mode over-sampling according to the sampling timing of multi-phase clock signals having the frequency not higher than the frequency of the input analog data signal by the sampling circuit.

16. The clock and data recovery method of claim 9, the input analog data signal is determined to be locked when occurrence probabilities of the phase locking direction determined to be a forward direction and a backward direction are substantially the same.

17. A signal receiving apparatus, comprising:
an equalizer circuit configured to receive an external signal perform equalization thereon to generate an input analog data signal;
a clock and data recovery circuit comprising:
a sampling circuit configured to perform a burst mode over-sampling on the input analog data signal according to a sampling timing in a burst mode to generate a plurality of over-sampling results;
a selection circuit configured to determine neighboring two of the over-sampling results having opposite logic states in the burst mode to accordingly select a plurality of data edge sampling results and a plurality of data center sampling results interlaced with each other and having a same time period with the input analog data signal from the over-sampling results to output a plurality of output sampling results;

a phase detection circuit configured to perform phase detection according to the output sampling results to generate a phase locking direction; and a phase adjusting circuit configured to adjust the sampling timing of the sampling circuit according to the phase locking direction to track the input analog data signal; and a digital processing circuit configured to receive and process an output digital data signal from the selection circuit.

18. The signal receiving apparatus of claim 17, wherein the selection circuit determines one of the neighboring two of the over-sampling results having the opposite logic states to be a data edge, and selects the data edge sampling results and the data center sampling results according to the data edge such that one of the data edge sampling results corresponds to the data edge.

19. The signal receiving apparatus of claim 17, wherein the phase detection circuit performs phase detection according to a logic state relation among consecutive three of the output sampling results.

20. The signal receiving apparatus of claim 17, wherein the selection circuit outputs the data center sampling results as the output digital data signal.

* * * * *